(12) United States Patent
Hernandez (10) Patent No.: US 11,846,664 B2
(45) Date of Patent: Dec. 19, 2023

(54) SOLID STATE ESD SIC SIMULATOR

(71) Applicant: FEI Company, Hillsboro, OR (US)

(72) Inventor: Marcos Hernandez, San Jose, CA (US)

(73) Assignee: FEI Company, Hillsboro, OR (US)

( * ) Notice: Subject to any disclaimer, the term of this patent is extended or adjusted under 35 U.S.C. 154(b) by 105 days.

(21) Appl. No.: 17/393,890

(22) Filed: Aug. 4, 2021

(65) Prior Publication Data

US 2023/0040961 A1 Feb. 9, 2023

(51) Int. Cl.
*G01R 31/3187* (2006.01)
*G01R 31/00* (2006.01)
*G01R 31/28* (2006.01)
*G01R 31/30* (2006.01)
*G01R 31/317* (2006.01)
*H01L 21/66* (2006.01)

(52) U.S. Cl.
CPC ....... *G01R 31/002* (2013.01); *G01R 31/2884* (2013.01); *G01R 31/3004* (2013.01); *G01R 31/31701* (2013.01); *H01L 22/34* (2013.01); *H01L 2924/00* (2013.01); *H01L 2924/0002* (2013.01)

(58) Field of Classification Search
CPC .. G01R 31/002; G01R 29/0864; G01R 29/02; G01R 29/0814; G01R 29/12; G01R 31/2884; G01R 31/3004; G01R 31/31701; H01L 2924/00; H01L 22/34; H01L 2924/0002
USPC ......... 324/71, 378, 403, 415, 425, 500, 537, 324/750.3
See application file for complete search history.

(56) References Cited

U.S. PATENT DOCUMENTS

| | | | |
|---|---|---|---|
| 4,742,427 A | 5/1988 | Richman | |
| 4,926,285 A | 5/1990 | Reinhardt et al. | |
| 7,560,948 B2 | 7/2009 | Grund | |
| 2006/0061929 A1* | 3/2006 | Duvvury | H01L 27/0266 361/91.1 |
| 2007/0018670 A1* | 1/2007 | Ito | G01R 31/002 324/750.3 |
| 2013/0187697 A1* | 7/2013 | Choy | H03K 17/6872 327/298 |
| 2018/0143233 A1* | 5/2018 | Graf | G01R 31/002 |
| 2020/0309834 A1* | 10/2020 | Lauderdale | G01R 29/12 |

OTHER PUBLICATIONS

Cree, Inc., "C3M0025065D Silicon Carbide Power MOSFET C3M™ MOSFET Technology," available from https://cms.wolfspeed.com/app/uploads/2021/05/C3M0025065D.pdf, 11 pages (Dec. 2020).
Cree, Inc., "C3M0060065K Silicon Carbide Power MOSFET C3M™ MOSFET Technology," available from https://cms.wolfspeed.com/app/uploads/2020/12/C3M0060065K.pdf, 12 pages (Jul. 2020).

* cited by examiner

*Primary Examiner* — Raul J Rios Russo
(74) *Attorney, Agent, or Firm* — Klarquist Sparkman, LLP (57) ABSTRACT

Electrostatic discharge (ESD) test systems include a FET-based pulse generator using pairs of back-to-back FETs coupled to produce an ESD pulse based on discharging a capacitor that is coupled in series with a device under test (DUT). A number of FETs can be selected based on an intended ESD test voltage magnitude.

20 Claims, 7 Drawing Sheets

SOLID STATE ESD SIC SIMULATOR

FIELD

The disclosure pertains to systems for electrostatic discharge testing.

BACKGROUND

Electrostatic discharge (ESD) testing is an essential part of verifying that semiconductor devices are robust enough for use in commercial products. Using ESD testing, manufacturers can confirm device performance in a successful test or modify the device to be more resistant to ESD prior commercial release. Typical ESD requirements for compliance with industry standards are divided into three model categories, a so-called machine model (MM), a human body model (HBM), and a charged device model (CDM). MM test requirements call for electrical pulse risetimes of 60 ns to 90 ns with pulse amplitudes of ±400 V or more. HBM-based testing requires risetimes of 2 ns to 10 ns and pulse amplitudes of ±8000 volts. CDM testing requires pulse amplitudes of ±2000 V with pulse risetimes of less than 300 ps. Devices must generally be tested with both positive and negative pulse voltages to confirm compliance with industry standards. Widespread ESD testing has permitted the reduction of device failure rates in response to ESD, and devices that were once susceptible to ESD damage can be routinely used.

Conventional ESD testing systems use mercury-wetted, high-pressure relays to produce the required pulses. Such relays have numerous deficiencies such as, for example, the use of a hazardous material. Semiconductor (solid state switches) are generally not fast enough, especially devices capable of producing the large pulse voltages required. Some semiconductor devices that appear to be sufficiently fast (such as avalanche transistors) have limitations such as being suitable to produce pulses only at a fixed, relatively low voltage, and not a random programmable discharge voltage as needed for ESD testing. Moreover, even if a semiconductor device were otherwise suitable for switching, semiconductor devices permit leakage currents that could destroy a semiconductor device under test (DUT) before an ESD stress is applied. For these and other reasons, alternative approaches to ESD testing are needed.

SUMMARY

Electrostatic discharge (ESD) test apparatus comprise at least a first FET and a second FET coupled in a back-to-back connection and a test voltage source operable to produce a bipolar test voltage. An ESD test capacitor is situated to be charged by the test voltage source and discharged through a device under test (DUT) and the first FET and a second FET to produce a test pulse in the DUT in response to a control pulse. In some examples, first and second opto-isolators are coupled to respective gates of the first FET and the second FET and to receive the control pulse from a pulse generator. In additional examples, first and second pulse circuits are coupled to respective outputs of the first and second opto-isolators and respective gates of the first and second FETs. In further examples, the pulse generator is coupled to the first and second opto-isolators to provide first and second gate pulses to respective gates of the first FET and the second FET. In typical examples, the test voltage source is operable to produce bipolar test voltages of magnitude of at least 200 V. In further embodiments, a current regulation resistor is situated so that the test voltage source is coupled to charge the ESD test capacitor through the current regulation resistor. In some examples, the ESD test capacitor switch selectable to produce an MM, HM, or CDM pulse. Typically, a source or drain of one of the first FET and the second FET is coupled between the current regulation resistor and the ESD test capacitor. In additional examples, an ESD test resistor situated in series with the ESD capacitor and the DUT so that an ESD test current is coupled to the DUT through the ESD test resistor and the ESD test resistor is selected based on an ESD test model. In still further embodiments, first and second power circuits are coupled to the first FET and the second FET, respectively, wherein the first and second power circuits provide independent voltages to the first pulse circuit and the second pulse circuit, respectively.

In some examples, the first FET and the second FET form a first back-to-back FET pair, and a plurality of FETs is coupled to the first back-to-back FET pair and operable to produce the test pulse in response to the pulse generator. The FETs of the plurality of FETs can be connected as back-to-back FET pairs. Respective opto-isolators, power circuits, and pulse circuits can be coupled to each of the plurality of FETs.

ESD test apparatus comprise a plurality of ESD pulse generators, each ESD pulse generator situated to produce an ESD test pulse in at least two or more DUTs in response to activation of at least one back-to-back connected FET pair. A matrix switch is coupled to the plurality of ESD pulse generators and is operable to selectively couple one or more of the ESD pulse generators to any of two or more DUTS. An ESD controller is coupled to the matrix switch and is operable to select DUTs for coupling to an EST pulse generator. In some examples, each of the ESD pulse generators comprises a plurality of pairs of back-to-back connected FETs and/or one or more sets of back-to-back connected FETs. In typical examples, a bipolar voltage source is provided and is operable to produce a voltage of magnitude of at least 400 V and is coupled to charge respective test pulse capacitors in each of the ESD pulse generators.

Methods comprise applying an ESD test pulse to a DUT by discharging an ESD test capacitor through a back-to-back-connected pair of SiC FETs in response to gate pulses applied to gates of the back-to-back connected pair of SiC FETs. In some examples, one or more of an MM, HM or CDM ESD test pulse is selected.

The foregoing and other feature, and advantages of the disclosed technology will become more apparent from the following detailed description, which proceeds with reference to the accompanying drawings.

DETAILED DESCRIPTION

Disclosed herein are methods and apparatus that can be used in ESD testing or other applications and can produce the necessary voltage pulses without the use of mercury-wetted relays as in conventional approaches. The disclosed methods and apparatus can also produce pulses of variable amplitudes, durations, and repetition rates as high as several MHz, including random amplitudes and polarities according to an intended ESD test mode. In addition, the disclosed approaches are configurable to supply pulses to a plurality of devices such as devices subject to testing for ESD compliance. The disclosed approaches are described with reference to SiC-based semiconductor devices, but other semiconductor devices can be used depending on pulse requirements. In addition, while the disclosed technology is described with reference to ESD testing, the pulse generation approaches can be configured for other applications such as high voltage sterilization, mass spectrometry, electron microscopy, ion implantation, transmission line pulsing, or others. The disclosed semiconductor-based approaches can be implemented so that leakage currents are not conducted through devices under test (DUTs). These leakage currents can, in some cases, damage devices under test, including devices that are suitably resistant to ESD-based damage.

In representative examples, the disclosed methods and apparatus can produce suitable pulsed waveforms with low pulse aberrations and the pulsed waveforms can comply with industry standards for ESD testing. Pulse amplitudes of at least 1 kV to 8 kV or higher with pulse durations of a few hundred ps to tens of ns can be produced at reasonable cost.

For purposes of explanation, a pair of FETs of the same type (P-channel or N-channel) having a common source or common drain connection are referred to herein as a back-to-back pair and such a connection is referred to as a back-to-back connection. In this back-to-back connection, sources (or drains) of two FETs are connected together. In such back-to-back connections, body diodes associated with the pair are connected to be antiparallel. In other examples, a pair of FETs of different types, i.e., one P-type FET and the other N-type FET, is connected source to drain or drain to source. Such connection is referred to herein as a front-to-back connection and the pair referred to as a front-to back pair. As with the back-to-back connection, diodes associated with such a pair are connected to be antiparallel. FETs of the same type that are connect source to drain or drain to source are referred to a series connection. As discussed below, in some examples, a set of series connected FETs of a first type is arranged to in a back-to-back connection with a series of FETs of the first type or a front-to-back connection with a series of FETs of a second type different from the first. For ESD and other applications, SiC-based FETs can be preferred as they are useful at higher voltages than FETs based on other materials.

Example 1

Figure 1A:
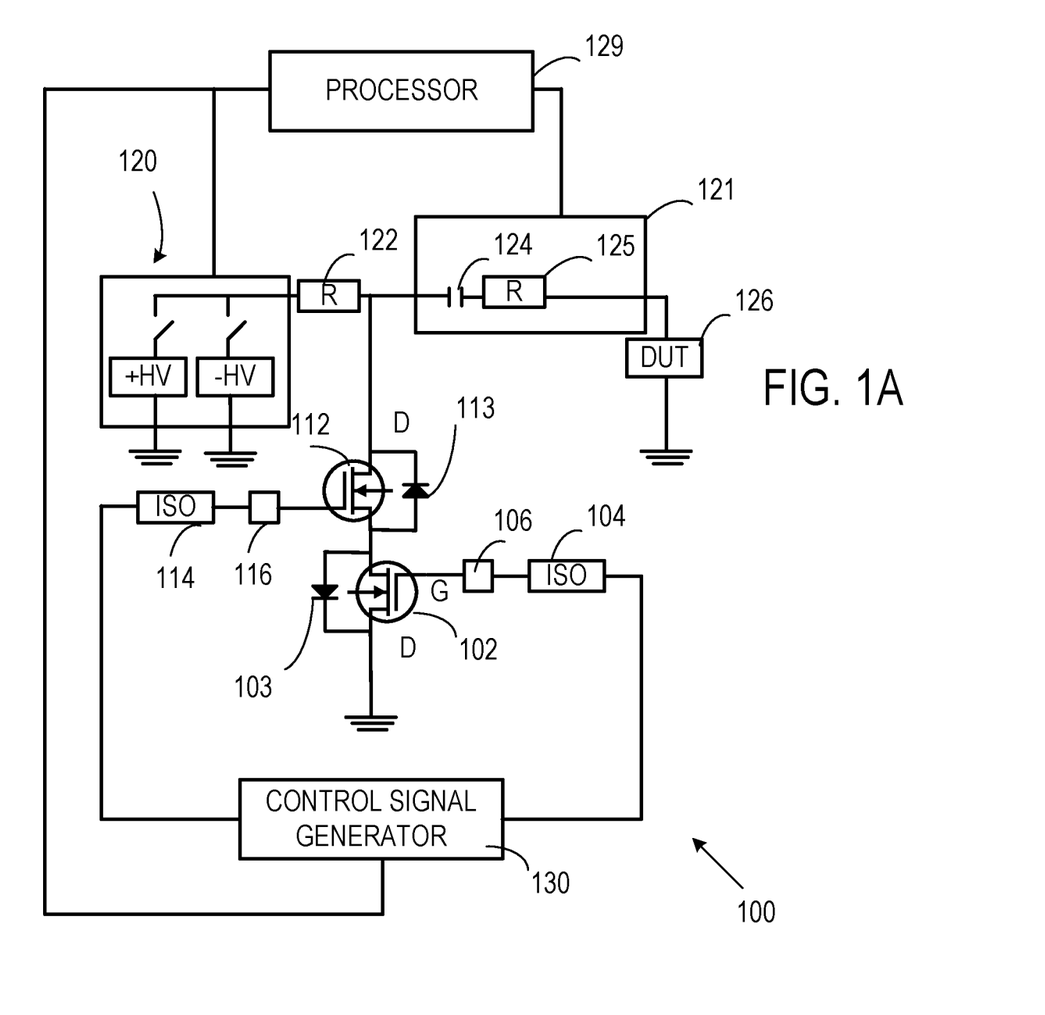
FIG. 1A illustrates a representative ESD test pulser.

Referring to FIG. 1A, a representative ESD test system 100 includes a first FET 102 and a second FET 112 connected so that a source (or drain) of the first FET 102 is connected to a source (or drain) of the second FET 112, i.e., the first FET 102 and the second FET 114 are connected in a back-to-back configuration and form a back-to-back pair.

In the example of FIG. 1A, the first FET 102 and the second FET 112 are N-channel SiC FETs. The first FET 102 and the second FET 112 are associated with first and second diodes 103, 113, respectively, typically referred to as body diodes. The first and second diodes 103, 113 are effectively in an antiparallel connection. A drain (or source) of the first FET 102 is coupled to a common connection, typically a ground connection. A drain (or source) of the second FET is connected between a current regulation resistor 122 and an ESD test capacitor 124 and an ESD test resistor 125 that form an ESD test model set 121. The ESD test capacitor 124 is coupled to be charged by a test voltage supply 120 through the current regulation resistor 122. In typical example, the test voltage supply 120 can produce bipolar voltages of magnitude of at least 200 V, 400 V, 500 V, 800 V, 1000 V, or more.

A control signal generator 130 is coupled to a first opto-isolator 104 and a second opto-isolator 114 that are in turn coupled to a first pulse circuit 106 and a second pulse circuit 116, respectively. Application of a control pulse to gates of the first FET 102 and the second FET 112 via the respective opto-isolators and pulse circuits permits the ESD test capacitor to be discharged by the first FET 102 and the second FET 112 thereby producing a test pulse in a device under test (DUT) 126. The duration, amplitude, and temporal shape of the test pulse in the DUT 126 is based on the capacitance of the test capacitor 124, the resistance of the test resistor 125, and the control pulse. In some examples, a processor 129 or other digital controller is situated to select capacitance values, test voltages, and pulse shapes based on the ESD model under consideration, generally based on values of components in the ESD model set 121, the selected voltage, and the control pulse.

Figure 1B:
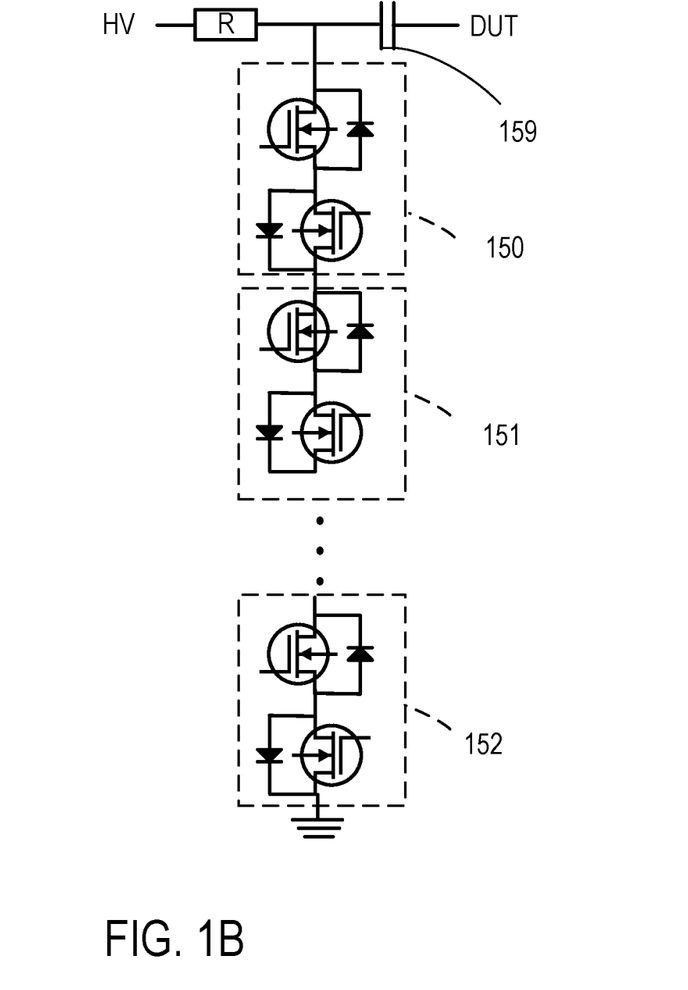
FIG. 1B illustrates an alternating stack of paired, back-to-back FETs that permits higher pulse voltages that those obtainable from a single pair of FETs.

While a back-to-back connected FET pair can be used, in some examples, a single pair of FETs is not suitable for the required voltages. FIG. 1B shows an alternate FET configuration that includes a plurality of back-to-back connected FET pairs 150, 151, 152 but more FET pairs can be provided as indicated. Gates of each of the FETs can be coupled to receive suitable pulses so that a test capacitor 159 is discharged by the FETs to produce an ESD test pulse in a DUT.

Figure 1C:
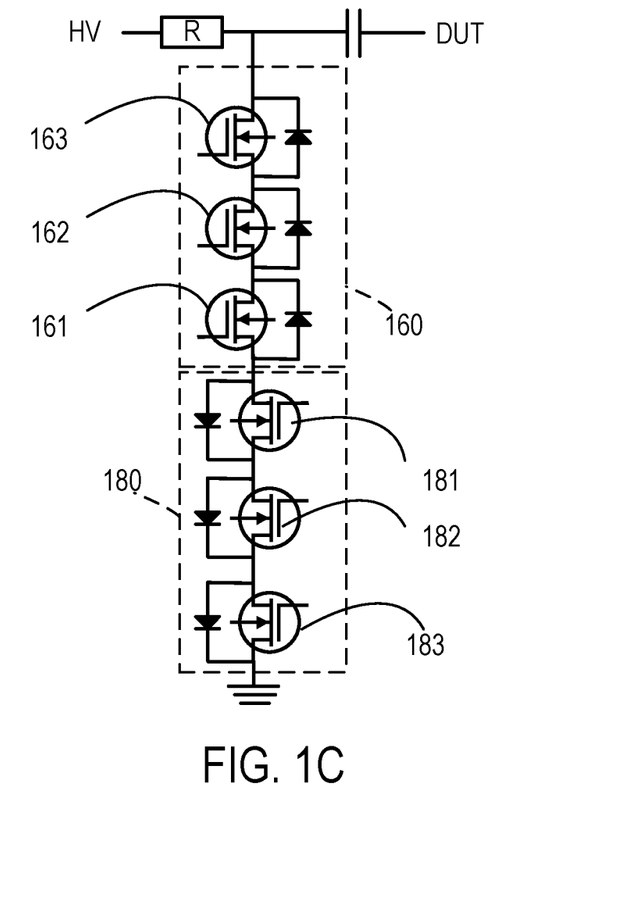
FIG. 1C illustrates a combination of first and second stacks of FETs in respective polarities that permit higher pulse voltages than those obtainable from a single pair of FETs.

In another example illustrated in FIG. 1C, a first plurality of FETs 160 of the same type (a series connection) and a second plurality of FETs 180 of the same type (a series connection) are coupled in a back-to-back configuration, i.e., a drain (or source) of FET 161 is connected to a source (or drain) of FET 181. FETs 161, 162, 163 of the first plurality 160 are connected in series and FETS 181, 182, 183 of the second plurality 180 are connected in series. Body diodes of the FETs 161, 162, 163 are antiparallel with respect to the body diodes of the FETs 181, 182, 183. Gate connections are not shown but each gate is generally coupled to a pulse circuit or otherwise coupled to receive a pulse signal to initiate an ESD test signal. FETs can be arranged in groups and as pairs as shown in FIGS. 1B-1C as convenient.

Generally, each FET in the above configurations requires a dedicated, isolated power supply. A total number of FETs needed depends on pulse voltage and FET characteristics. In one example, a 1700 V pulser uses 12 transistors, 6 to provide positive pulses and 6 to provide negative pulses.

In other examples, various combinations of P-channel and N-channel FETs can be used.

Example 2

Figure 2:
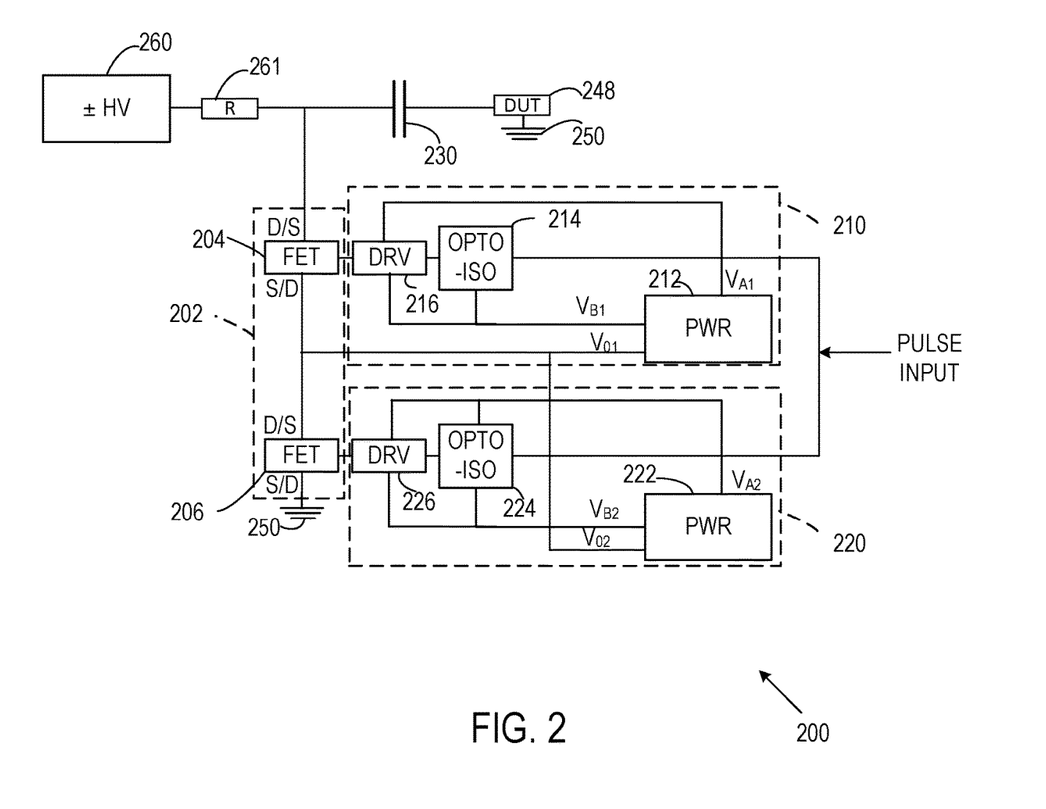
FIG. 2 illustrates a representative FET-based ESD test pulser that includes a single pair of back-to-back FETs, each powered by a respective power supply.

Referring to FIG. 2, a representative ESD test apparatus 200 includes a FET pair 202 comprising a first FET 204 and a second FET 206 having a back-to-back connection. Respective FET drivers 210, 220 are coupled to gates of the first FET 204 and the second FET 206 to initiate ESD test pulses by discharging a capacitor 230 to a ground connection 250 via a DUT 248. The FET drivers 210, 220 includes respective power supplies 212, 222, opto-isolators 214, 224, and pulse drivers 216, 226. The opto-isolators 214, 224 are coupled to receive a pulse input from a control pulse source that is not shown. The power supplies 212, 224 generally provide power at several voltages indicated in FIG. 2 as $V_{A1}$, $V_{B1}$, $V_{O1}$, $V_{A2}$, $V_{B2}$, and $V_{O2}$ such as some or all of −5 V, 0 V, +5V, and +20 V or other voltages as needed. A high voltage power supply 260 is situated to charge the capacitor 230 via a current regulation resistor 261 and can be operable to supply voltages in a range of −2 kV to +2 kV or more as needed.

Example 3

Figure 3:
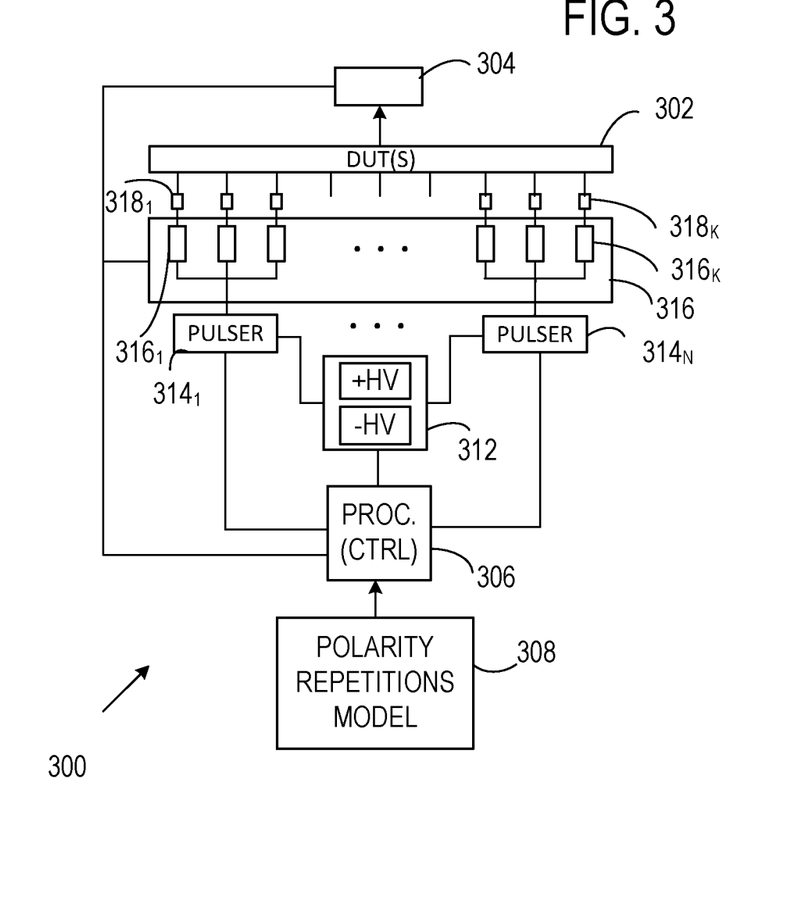
FIG. 3 illustrates a representative ESD test system that includes a FET-based test pulser and a switch matrix.

Referring to FIG. 3, an ESD test system 300 is operable to selectively apply ESD test pulses to any of a plurality of DUTs 302 and to assess DUTs prior to or after EST test pulsing with a measurement system 304. The ESD test system 300 includes ESD pulse generators such as pulsers 314$_1$, . . . , 314$_N$, wherein N is a positive integer. The pulsers 314$_1$, . . . , 314$_N$ are coupled to a switch matrix 316 that includes switches 316$_1$, . . . 316$_K$, wherein K is a positive integer, that are coupled to respective capacitors 318$_1$, . . . , 318$_K$ that can provide ESD test pulses to selected DUTs as controlled by a processor 306. Typically, each of the pulsers 314$_1$, . . . , 314$_N$ is coupled to more than one of the switches 316$_1$, . . . 316$_K$ (K>N), and as shown each is connected to three switches. A high voltage power supply 312 is coupled to the pulsers and can be a variable voltage bipolar power supply, but fixed, unipolar power supplies can be used. In other examples, multiple power supplies can be used.

The processor 306 is coupled to a memory device 308 that stores processor-executable instructions for selecting an ESD test model to determine pulse characteristics such as amplitude or duration, ESD pulse polarity, numbers of EST test pulses to be applied, and selection of DUTs for testing. The processor 308 is coupled to the switch matrix to select appropriate DUTs for testing and can select a test voltage from the high voltage power supply 312. In some examples, the processor 306 is coupled to a network to communicate test results and to receive instructions on test pulses to be applied and DUTs to be selected.

Example 4

Figure 4:
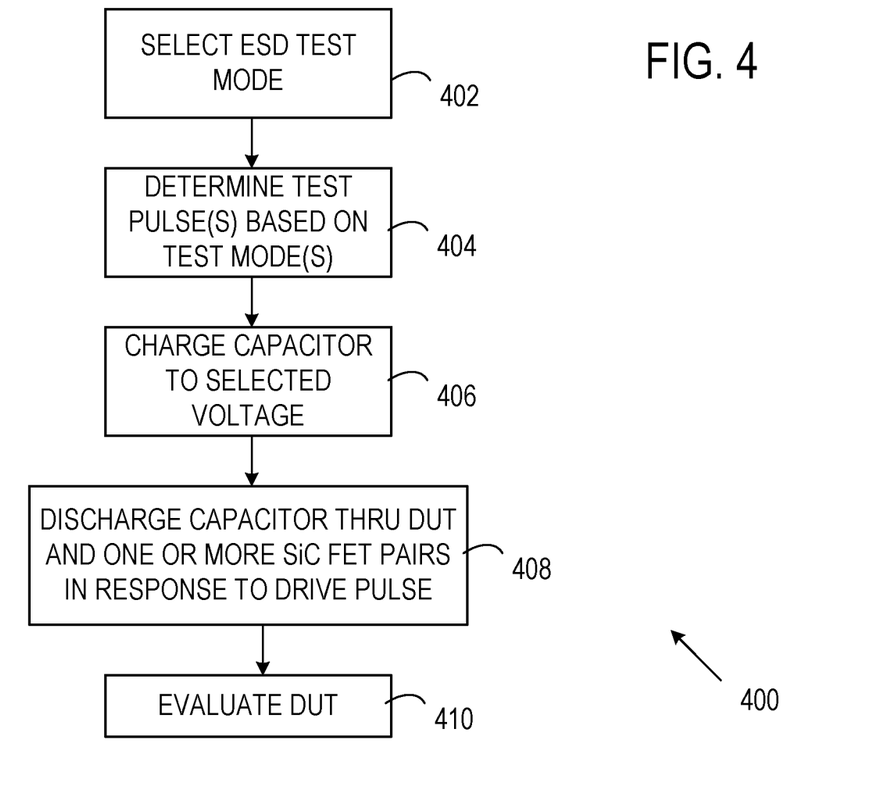
FIG. 4 illustrates a representative ESD test method.

Referring to FIG. 4, a representative method 400 of ESD testing includes selecting an ESD test model at 402 and determining one or more test pulses at 404 based on the selected model. Test pulses can be selected to have suitable amplitudes, polarities, pulse durations, or other properties. At 406, a suitable capacitor is charged to a test voltage and at 408, the capacitor is discharged through a DUT and one or more FET pairs, typically at least one back-to-back FET pair. At 410, the DUT is evaluated to determine response to the test pulse. As discussed above, in some examples, multiple DUTs are tested, and different test pulses can be used for some or all DUTs.

Example 5

Figure 5:
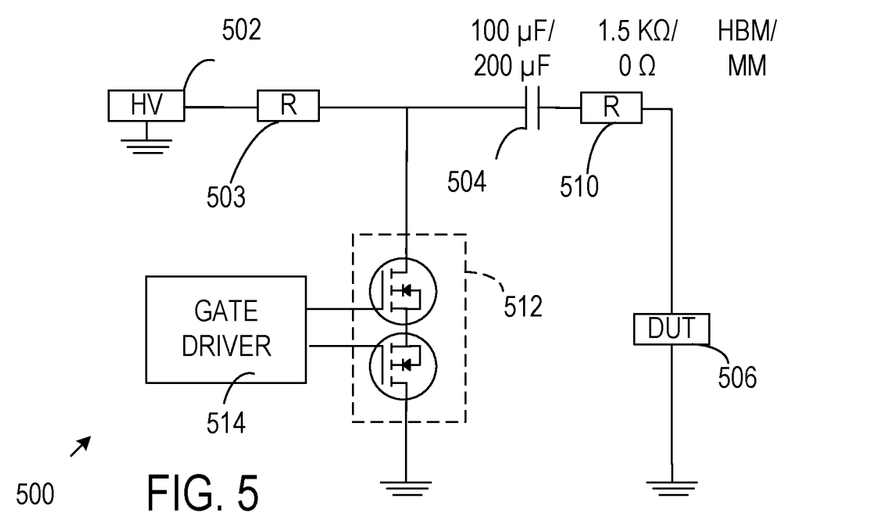
FIG. 5 illustrates another FET-based ESD test pulser that includes power supply for each FET.

FIG. 5 illustrates an example system 500 indicating some components and values to be used with HBM model and MM model ESD testing. The system 500 includes a high voltage power supply 502 that is connected to charge a capacitor 504 with current regulated by a resistor 503. The capacitor 504 is situated to be discharged through a DUT 506 via a resistor 510 in response to a pulse applied to gates of the back-to back FET pair 512 by a gate driver 514. As shown, for an HBM model pulse and an MM model pulse, the capacitor 504 has capacitance values 100 µF or 200 pF, respectively, and the resistor 510 has resistance values of 1.5 kΩ and 0Ω, respectively. Resistors and capacitors used for different ESD models can be switchable either manually or as controlled by a processor.

Example 6

Figure 6:
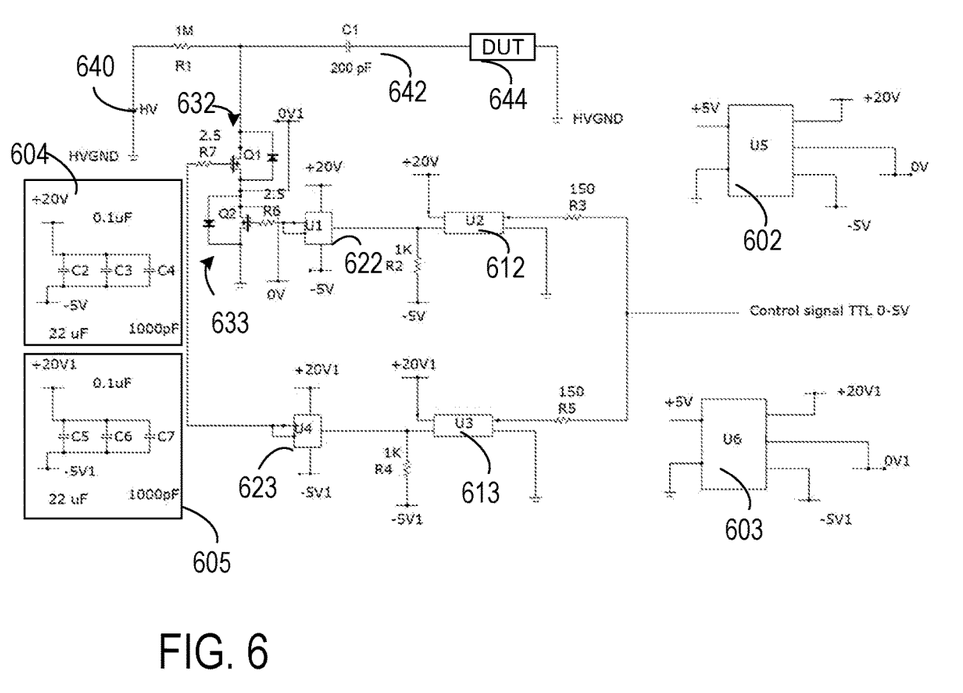
FIG. 6 illustrates another FET-based ESD test pulser.

With reference to FIG. 6, an ESD test pulse generator 600 includes isolated DC-DC convertors 602, 603 that are coupled to receive +5 V inputs and produce isolated +20 V and −5 V outputs (noted as +20 V, +5 V and +20 V1 and −5 V1) which are directed to capacitor networks 604, 605, respectively. Opto-isolators 612, 613 are powered by the DC-DC convertors 602, 604 and are coupled to a TTL control signal. In response to the TTL control signal, the opto-isolators 612, 613 produce pulse outputs to respective gate drivers 622, 623, also powered by the associated isolated DC-DC convertors 602, 603. The gate drivers 622, 623 are coupled to gates of respective FETs 632, 633. A high voltage power supply 640 is coupled to a capacitor 642 that can be discharged to produce an ESD test pulse in a DUT 644.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

As used herein, a high voltage (HV) refers to a voltage of magnitude of at least 200 V, 500 V, 1000 V, or 2000 V. In some examples, HV power supplies can produce HV with both polarities, but multiple HV power supplies can be used and minimum and maximum voltages can have different magnitudes.

ESD testing can be controlled with a processor provided with processor-executable instructions that can be stored in a local memory device, at a remote memory device, or provided via a network. While ESD pulsers can be driven with a digital pulse, a digital to analog convertor can be used to produce desired pulse shapes. A processor can be coupled to an HV power supply to select voltage and polarity and can also be coupled to switch resistors and capacitors as needed depending on the ESD test model to be used. The processor can also be coupled to measurement systems to evaluate DUT performance before and/or after being subjected to ESD test pulses. In addition, the processor can select ESD test pulse magnitude, polarity, pulse temporal shape, pulse duration, and pulse repetition rate using analog or digital control signals. The processor can also provide random pulse amplitudes, durations, polarities, and pulse waveforms.

In view of the many possible embodiments to which the principles of the disclosed technology may be applied, it should be recognized that the illustrated embodiments are only preferred examples and should not be taken as limiting the scope of the disclosure.

I claim:

1. An electrostatic discharge (ESD) test apparatus, comprising:
   at least a first field-effect transistor (FET) and a second FET coupled in a back-to-back connection;
   a test voltage source operable to produce a bipolar test voltage;
   an ESD test capacitor situated to be charged by the test voltage source and discharged through a device under test (DUT) and the first FET and a second FET to produce a test pulse in the DUT; and
   a pulse generator coupled to produce a control pulse operable to cause discharge of the ESD test capacitor and production of the test pulse.

2. The ESD apparatus of claim 1, further comprising first and second opto-isolators coupled to respective gates of the first FET and the second FET and coupled receive the control pulse from the pulse generator.

3. The ESD apparatus of claim 2, further comprising first and second pulse circuits coupled to respective outputs of the first and second opto-isolators and respective gates of the first and second FETs.

4. The ESD apparatus of claim 3, further comprising a pulse generator coupled to the first and second opto-isolators to provide first and second gate pulses to respective gates of the first FET and the second FET.

5. The ESD apparatus of claim 4, wherein the test voltage source is operable to produce a bipolar test voltage of at least 200 V.

6. The ESD apparatus of claim 5, further comprising a current regulation resistor, wherein the test voltage source is coupled to charge the ESD test capacitor through the current regulation resistor.

7. The ESD apparatus claim 6, wherein the ESD test capacitor is operable to produce a machine model (MM), a human body model (HBM), or a charged device model (CDM) pulse.

8. The ESD apparatus of claim 7, wherein a source or drain of one of the first FET and the second FET is coupled between the current regulation resistor and the ESD test capacitor.

9. The ESD apparatus of claim 8, further comprising an ESD test resistor situated in series with the ESD capacitor and the DUT so that an ESD test current is coupled to the DUT through the ESD test resistor.

10. The ESD apparatus of claim 9, wherein the ESD test resistor is selected based on an ESD test model.

11. The ESD apparatus of claim 3, further comprising first and second power circuits coupled to the first FET and the second FET, respectively, wherein the first and second power circuits provide independent voltages to the first pulse circuit and the second pulse circuit, respectively.

12. The ESD test apparatus of claim 1, wherein the first FET and the second FET form a first back-to-back FET pair, and further comprising a plurality of FETs coupled to the first back-to-back FET pair and operable to produce the test pulse in response to the pulse generator.

13. The ESD apparatus of claim 12, wherein the FETs of the plurality of FETs are connected as back-to-back FET pairs.

14. The ESD apparatus of claim 12, further comprising respective opto-isolators, power circuits, and pulse circuits coupled to each of the plurality of FETs.

15. An electrostatic discharged (ESD) test apparatus, comprising:
   a plurality of ESD pulse generators, each ESD pulse generator situated to produce an ESD test pulse in at least two or more devices under test (DUTs) in response to activation of at least one back-to-back connected field-effect transistor (FET) pair;
   a matrix switch coupled to the plurality of ESD pulse generators and operable to selectively couple one or more of the ESD pulse generators to any of two or more DUTS; and
   an ESD controller coupled to the matrix switch and operable to select DUTs for coupling to an EST pulse generator.

16. The ESD test apparatus of claim 15, wherein each of the ESD pulse generators comprises a plurality of pairs of back-to-back connected FETs.

17. The ESD test apparatus of claim 15, wherein each of the ESD pulse generators comprises a plurality of sets of back-to-back connected FETs.

18. The ESD test apparatus of claim 16, further comprising a bipolar voltage source operable to produce a voltage of magnitude of at least 400 V and coupled to charge respective test pulse capacitors in each of the ESD pulse generators.

19. A method comprising, generating and applying an electrostatic discharge (ESD) test pulse to a device under test (DUT) by discharging an ESD test capacitor through a back-to-back-connected pair of silicon carbide (SiC) field-effect transistors (FETs) in response to gate pulses applied to gates of the back-to-back connected pair of SiC FETs.

20. The method of claim 19, further comprising selecting a machine model (MM), a human body model (HBM), or a charged device model (CDM) ESD pulse.

* * * * *

UNITED STATES PATENT AND TRADEMARK OFFICE
CERTIFICATE OF CORRECTION

PATENT NO. : 11,846,664 B2
APPLICATION NO. : 17/393890
DATED : December 19, 2023
INVENTOR(S) : Marcos Hernandez It is certified that error appears in the above-identified patent and that said Letters Patent is hereby corrected as shown below:

In the Claims

In Column 7, Claim 2, Line 53, delete "ESD apparatus" and insert -- ESD test apparatus --, therefor.

In Column 7, Claim 3, Line 57, delete "ESD apparatus" and insert -- ESD test apparatus --, therefor.

In Column 7, Claim 4, Line 61, delete "ESD apparatus" and insert -- ESD test apparatus --, therefor.

In Column 7, Claim 5, Line 65, delete "ESD apparatus" and insert -- ESD test apparatus --, therefor.

In Column 8, Claim 6, Line 1, delete "ESD apparatus" and insert -- ESD test apparatus --, therefor.

In Column 8, Claim 7, Line 5, delete "ESD apparatus claim" and insert -- ESD test apparatus of claim --, therefor.

In Column 8, Claim 8, Line 9, delete "ESD apparatus" and insert -- ESD test apparatus --, therefor.

In Column 8, Claim 9, Line 14, delete "ESD apparatus" and insert -- ESD test apparatus --, therefor.

In Column 8, Claim 10, Line 18, delete "ESD apparatus" and insert -- ESD test apparatus --, therefor.

In Column 8, Claim 11, Line 20, delete "ESD apparatus" and insert -- ESD test apparatus --, therefor.

In Column 8, Claim 13, Line 30, delete "ESD apparatus" and insert -- ESD test apparatus --, therefor.

In Column 8, Claim 14, Line 34, delete "ESD apparatus" and insert -- ESD test apparatus --, therefor.

Signed and Sealed this
Thirtieth Day of January, 2024

Katherine Kelly Vidal
*Director of the United States Patent and Trademark Office*